(12) United States Patent
Tomohiro

(10) Patent No.: US 10,290,789 B2
(45) Date of Patent: May 14, 2019

(54) LIGHT EMITTING DEVICE, MANUFACTURING METHOD FOR THE LIGHT EMITTING DEVICE, AND LIGHTING MODULE HAVING THE LIGHT EMITTING DEVICE

(71) Applicant: LG INNOTEK CO., LTD., Seoul (KR)

(72) Inventor: Sampei Tomohiro, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 9 days.

(21) Appl. No.: 15/663,038

(22) Filed: Jul. 28, 2017

(65) Prior Publication Data

US 2018/0006207 A1    Jan. 4, 2018

Related U.S. Application Data

(63) Continuation of application No. 15/196,589, filed on Jun. 29, 2016, now Pat. No. 9,761,776.

(51) Int. Cl.
*H01L 33/64*     (2010.01)
*H01L 33/48*     (2010.01)
(Continued)

(52) U.S. Cl.
CPC .......... *H01L 33/642* (2013.01); *H01L 27/156* (2013.01); *H01L 33/20* (2013.01);
(Continued)

(58) Field of Classification Search
CPC ....... H01L 33/642; H01L 33/36; H01L 33/50; H01L 33/60; H01L 27/156
See application file for complete search history.

(56) References Cited

U.S. PATENT DOCUMENTS 6,320,140 B1\* 11/2001 Enomoto ............. H05K 3/4617
174/255
2002/0016018 A1\* 2/2002 Oka ....................... H01L 21/486
438/64
(Continued)

FOREIGN PATENT DOCUMENTS

EP          2523230 A2    11/2012
EP          2528120 A2    11/2012
(Continued)

OTHER PUBLICATIONS

European Search Report for European Application No. 16177169, dated Oct. 5, 2016.

*Primary Examiner* — Feifei Yeung Lopez
(74) *Attorney, Agent, or Firm* — LRK Patent Law Firm

(57) ABSTRACT

A light emitting device includes: a first support member having an opening; a second support member disposed in the opening of the first support member; an adhesive member disposed between the first and second support members; a first lead electrode disposed on the second support member; a second lead electrode disposed on at least one of the first and second support members; a light emitting chip disposed on the first lead electrode, the light emitting chip being electrically connected to the second lead electrode; and a conductive layer disposed under the second support member, wherein the first support member includes a resin material, the second support member includes a ceramic material, and the first lead electrode is disposed between the light emitting chip and the second support member.

20 Claims, 17 Drawing Sheets

(51) Int. Cl.
*H01L 27/15* (2006.01)
*H01L 33/20* (2010.01)
*H01L 33/36* (2010.01)
*H01L 33/50* (2010.01)
*H01L 33/60* (2010.01)

(52) U.S. Cl.
CPC ............ *H01L 33/36* (2013.01); *H01L 33/486* (2013.01); *H01L 33/50* (2013.01); *H01L 33/60* (2013.01); *H01L 33/64* (2013.01); *H01L 2224/48091* (2013.01)

(56) References Cited

U.S. PATENT DOCUMENTS

| | | | |
|---|---|---|---|
| 2002/0041320 A1* | 4/2002 | Takizawa | B41J 2/335 347/171 |
| 2003/0230799 A1* | 12/2003 | Yee | H01L 23/3128 257/706 |
| 2006/0261364 A1 | 11/2006 | Suehiro et al. | |
| 2009/0200570 A1* | 8/2009 | Mori | H01L 33/642 257/99 |
| 2009/0315056 A1* | 12/2009 | Kim | H01L 33/641 257/98 |
| 2010/0065318 A1* | 3/2010 | Nagasawa | H01L 23/49827 174/260 |
| 2010/0129964 A1* | 5/2010 | Goh | H01L 21/4832 438/124 |
| 2010/0301474 A1* | 12/2010 | Yang | H01L 21/6835 257/737 |
| 2012/0286319 A1 | 11/2012 | Lee et al. | |
| 2012/0299038 A1 | 11/2012 | Hwang et al. | |
| 2013/0044477 A1 | 2/2013 | Lee et al. | |
| 2013/0193464 A1 | 8/2013 | Bae et al. | |
| 2013/0271992 A1 | 10/2013 | Kim et al. | |

FOREIGN PATENT DOCUMENTS

| | | |
|---|---|---|
| EP | 2560205 A2 | 2/2013 |
| EP | 2613370 A2 | 7/2013 |
| KR | 10-1049698 B1 | 7/2011 |
| KR | 10-2012-0072689 A | 7/2012 |
| KR | 10-2012-0121704 A | 11/2012 |
| KR | 10-2013-0032202 A | 4/2013 |
| KR | 10-2005-0116373 A | 12/2015 |

* cited by examiner

LIGHT EMITTING DEVICE, MANUFACTURING METHOD FOR THE LIGHT EMITTING DEVICE, AND LIGHTING MODULE HAVING THE LIGHT EMITTING DEVICE

CROSS-REFERENCE TO RELATED APPLICATIONS

The present application is a continuation of U.S. patent application Ser. No. 15/196,589, filed Jun. 29, 2016, which claimed priority to Korean Patent Application No. 10-2015-0093516, filed Jun. 30, 2015, the disclosures of which are incorporated by reference in their entireties herein.

BACKGROUND

1. Field of the Invention

The present disclosure relates to a light emitting device, a manufacturing method for the light emitting device, and a lighting module having the light emitting device.

2. Description of Related Art

Light emitting devices include light emitting diodes. The light emitting diodes are semiconductor devices that convert electrical energy into light, and have come into the spotlight as a next-generation light source that replace fluorescent lamps and incandescent lamps.

The light emitting diodes generate light using semiconductor devices, and thus consume only very low power, as compared with the incandescent lamps that generate light by heating tungsten or the fluorescent lamps that generate light by allowing ultraviolet light generated through high-pressure discharge to collide with a fluorescent substance.

The light emitting diodes are being increasingly used as light sources of lighting devices such as indoor and outdoor lamps, liquid crystal displays, electronic boards, and streetlights.

SUMMARY

Embodiments provide a light emitting device having a new heat dissipation structure.

Embodiments provide a light emitting device in which a second support member having a light emitting chip disposed thereon is disposed in an inside or opening of a first support member.

Embodiments provide a light emitting device in which a second support member having a low thermal resistance is disposed in an inside or opening of a first support member, and a light emitting chip is disposed on the second support member.

Embodiments provide a light emitting device in which a first support member and a second support member having a light emitting chip disposed thereon are adhered to each other using an adhesive member.

Embodiments provide a light emitting device in which a first support member made of a resin material and a second support member made of a ceramic material are adhered to each other using an adhesive member, and one or a plurality of light emitting chips are disposed on the second support member, and a lighting module having the light emitting device.

Embodiments provide a light emitting device in which a lead electrode is disposed between a second support member and a light emitting chip, and a lighting module having the light emitting device.

Embodiments provide a light emitting device in which a portion of an adhesive layer in a first support member is adhered to a second support member, and a manufacturing method for the light emitting device.

In one embodiment, a light emitting device includes: a first support member having an opening; a second support member disposed in the opening of the first support member; an adhesive member disposed between the first and second support members; a first lead electrode disposed on the second support member; a second lead electrode disposed on at least one of the first and second support members; a light emitting chip disposed on the first lead electrode, the light emitting chip being electrically connected to the second lead electrode; and a conductive layer disposed under the second support member, wherein the first support member includes a resin material, the second support member includes a ceramic material, and the first lead electrode is disposed between the light emitting chip and the second support member.

In another embodiment, a lighting module includes: a first support member having an opening; a second support member disposed in the opening of the first support member; an adhesive member disposed between the first and second support members; a first lead electrode disposed on the second support member; a second lead electrode disposed on at least one of the first and second support members; a plurality of light emitting chips disposed on the first lead electrode, the light emitting chips being electrically connected to the second lead electrode; a protective layer disposed on the first and second lead electrodes; and a conductive layer made of a metallic material, the conductive layer being disposed under the first and second support members, wherein the first support member includes a resin material, the second support member includes a ceramic material, and the plurality of light emitting chips are disposed between the first lead electrode and the second support member.

In still another embodiment, a method for manufacturing a light emitting device includes: providing a first support member having an adhesive layer including an opening therein and an adhesive layer between different resin layers; inserting a second support member made of a ceramic material into the opening of the first support member; if the first support member is compressed, allowing a portion of the adhesive layer to be moved into the opening and adhered to the second support member; forming a lead electrode on the first and second lead members; and disposing a light emitting chip on the lead electrode disposed on the support members, wherein the adhesive layer is disposed at top and bottom edge portions of the second support member, to be adhered to the lead electrode.

The details of one or more embodiments are set forth in the accompanying drawings and the description below. Other features will be apparent from the description and drawings, and from the claims.

DETAILED DESCRIPTION OF THE EMBODIMENTS

Figure 1:
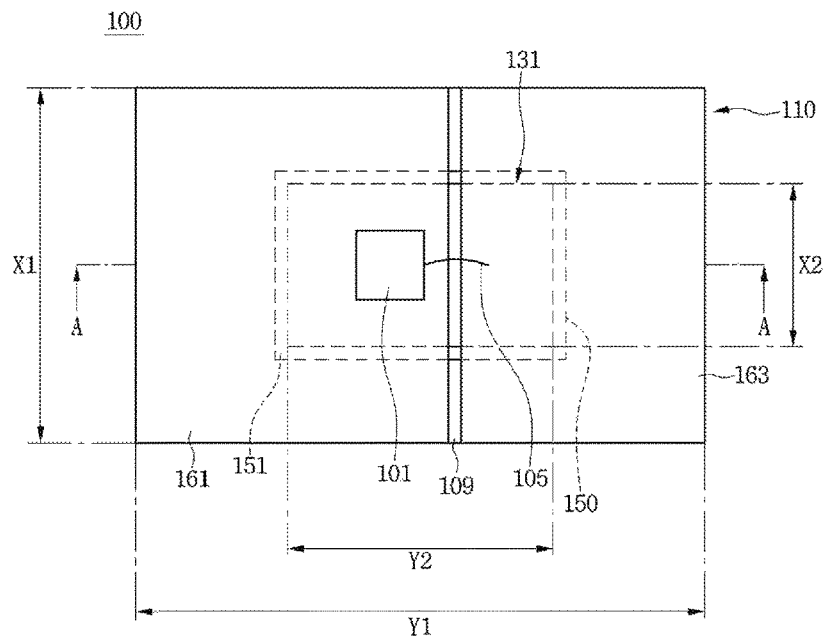
FIG. 1 is a plan view showing a light emitting device according to a first embodiment.

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer will be described with reference to the drawings.

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below. In the drawings, like parts and portions are designated by like reference numerals and overlapping is avoided with respect to explanation of these parts and portions.

Figure 2:
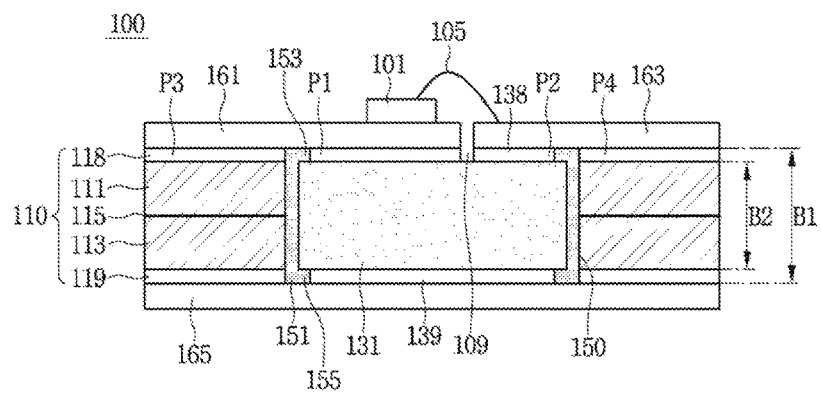
FIG. 2 is a sectional view taken along line A-A of the light emitting device of FIG. 1.

FIG. 1 is a plan view showing a light emitting device according to a first embodiment. FIG. 2 is a sectional view taken along line A-A of the light emitting device of FIG. 1.

Referring to FIGS. 1 and 2, the light emitting device 100 includes a light emitting chip 101, a first support member 110 having an opening 150, a second support member 131 located in the opening 150 of the first support member 110, the second support member 131 being disposed under the light emitting chip 101, a first lead electrode 161 disposed between the second support member 131 and the light emitting chip 101, a second lead electrode 163 disposed on at least one of the first and second support members 110 and 131, and a conductive layer 165 disposed under the first and second support members 110 and 131.

The light emitting chip 101 may selectively emit light in the range from a visible ray band to an ultraviolet (UV) band. The light emitting chip 101 may include, for example, at least one of a UV LED, a red LED, a blue LED, a green LED, a yellow green LED, and a white LED.

The light emitting chip 101 may include at least one of the structure of a horizontal chip, in which two electrodes in the chip are disposed adjacent to each other and the structure of a vertical chip, in which two electrodes in the chip are disposed at sides opposite to each other.

When the light emitting chip 101 is a vertical chip, the light emitting chip 101 may be connected to the first lead electrode 161 and connected to the second lead electrode 163 through a wire 105. As another example, when the light emitting chip 101 is a horizontal chip, the light emitting chip 101 may be connected to the first and second lead electrodes 161 and 163 through the wire 105, but the present disclosure is not limited thereto. When the light emitting chip 101 is mounted in a flip-chip manner, the light emitting chip 101 may be flip-bonded on the first and second lead electrodes 161 and 163.

The first support member 110 includes a resin material, and the second support member 131 includes a nonmetallic or ceramic material. The first support member 110 may be a resin substrate or an insulating substrate, and the second support member 131 may be a ceramic substrate or a heat dissipation substrate.

The first support member 110 may include a resin material, e.g., at least one of a flame retardant (FR)-based material and a composite epoxy material (CEM). The light emitting device 100 according to the embodiment uses the first support member 110, so that it is possible to save manufacturing cost and material cost of the light emitting device 100 and to reduce the weight of the light emitting device 100.

The second support member 131 may include a material having a higher thermal conductivity and a lower heat resistance than the resin material. The second support member 131 may be made of, for example, oxide, carbide, or nitride formed by bonding a metal element such as silicon (Si), aluminum (Al), titanium (Ti), or zirconium (Zr) to oxygen, carbon, or nitrogen. The second support member 131 may include an aluminum nitride (AlN) material. As another example, the second support member 131 may include at least one of silicon carbide (SiC), alumina ($Al_2O_3$), zirconium oxide ($ZrO_2$), silicon nitride ($Si_3N_4$), and boron nitride (BN) materials. The thermal conductivity of AlN may be 70 to 250 W/mK, the terminal conductivity of BN may be 60 to 200 W/mK, the thermal conductivity of $Si_3N_4$ may be 60 to 90 W/mk, the thermal conductivity of Si may be 150 W/mK, the thermal conductivity of SiC may be 270 W/mK, and the thermal conductivities of $Al_2O_3$ and $ZrO_2$ may be 20 to 30 W/mK. The second support member 131 may include a material having a thermal conductivity of 60 W/mK or more.

The first support member 110 includes the opening 150 as shown in FIG. 2. The top-view shape of the opening 150 may include at least one of a polygonal shape and a circular or elliptical shape. The second support member 131 may be disposed in the opening 150. Accordingly, it is possible to decrease the thickness of the light emitting device 100 and to ensure a heat dissipation path. The second support member 131 is disposed inside the first support member 110, and therefore, the first and second support members 110 and 130 may not be stacked.

As shown in FIG. 1, the lateral and longitudinal lengths Y2 and X2 of the second support member 131 may be smaller than the lateral and longitudinal lengths of the opening 150, respectively. The lateral and longitudinal lengths Y2 and X2 of the second support member 131 may be smaller than the lateral and longitudinal lengths Y1 and X1 of the first support member 110, respectively. Accordingly, the first support member 110 can face the second support member 131 at the circumference of the second support member 131. The first support member 110 surrounds the second support member 131.

Figure 3:
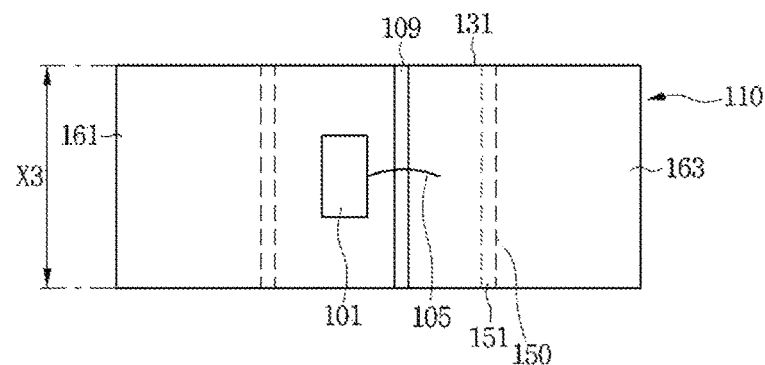
FIG. 3 is a view showing another example of the light emitting device of FIG. 1.

As another example, when the longitudinal length of the opening 150 is equal to or smaller than the longitudinal length X3 of the second support member 131 as shown in FIG. 3, two sides of the second support member 131 may not face the first support member 110. Hereinafter, for convenience of illustration, the structure in which the second support member 131 is inserted into the opening 150 as shown in FIG. 1 will be described.

Referring to FIG. 2, the first support member 110 the first support member 110 may include at least one resin layer 111 and 113, and a metal layer 118 and 119 disposed on at least one of top and bottom surfaces of the resin layer 111 and 113. The resin layer 111 and 113 may be formed in a single layer or multiple layers. The resin layer 111 and 113 may be formed in multiple layers, and may include, for example, a first resin layer 111 and a second resin layer 113 disposed under the first resin layer 111. The first and second resin layers 11 and 113 may be spaced apart from each other or may be adhered to each other by an adhesive member. The metal layer 118 and 119 may be formed in a single layer or multiple layers. The metal layer 118 and 119 may be formed in multiple layers, and may include a first metal layer 118 disposed on a top surface of the first resin layer 111 and a second metal layer 119 disposed on a bottom surface of the second resin layer 113. Each of the first and second metal layers 118 and 119 may be formed in a single layer or multiple layers.

The first and second resin layers 111 and 113 may include the same resin material, e.g., an FR-based material and a CEM. The first and second metal layers 118 and 119 may be formed of at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof.

The first metal layer 118 may be selectively disposed at a portion or the whole of a top surface of the first support member 110 depending on a pattern shape, but the present disclosure is not limited thereto. The first metal layer 118 may be divided into electrode patterns P3 and P4 selectively connected to the different lead electrodes 161 and 163. The second metal layer 119 may be selectively disposed at a portion or the whole of a bottom surface of the first support member 110 depending on a pattern shape, but the present disclosure is not limited thereto.

The first support member 110 may include an adhesive layer 115 between the first and second resin layers 111 and 113, and the adhesive layer 115 allows the first and second resin layers 111 and 113 to be adhered to each other therethrough. The adhesive layer 115 may include at least one of silicon, epoxy, and prepreg. When the first and second layers 111 and 113 are formed as a single layer, the adhesive layer 115 may be removed, but the present disclosure is not limited thereto.

Meanwhile, a metal layer 138 and 139 may be formed on at least one of top and bottom surfaces of the second support member 131. The metal layer 138 and 139 includes a third metal layer 138 disposed on the top surface of the second support member 131 and a fourth metal layer 139 disposed on the bottom surface of the second support member 131.

The third and fourth metal layers 138 and 139 may be formed of at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof. Each of the third and fourth metal layers 138 and 139 may be formed in a single layer or multiple layers. The second support member 131 having the third and fourth metal layers 138 and 139 may be defined as a ceramic substrate or a heat dissipation substrate.

The third metal layer 138 may be spaced apart from a top edge of the second support member 131. The third metal layer 138 may be divided into at least two electrode patterns P1 and P2. The at least two patterns P1 and P2 contact the second support member 131 on the second support member 131, and may be electrically connected to the light emitting chip 101. The at least two electrode patterns P1 and P2 may be divided by a gap 109, but the present disclosure is not limited thereto. The shape of the gap 109 may include at least one of a linear shape, a bent shape, and a curved shape.

The at least two electrode patterns P1 and P2 include a first electrode pattern P1 and a second electrode pattern P2, and the first electrode pattern P1 may be disposed between the light emitting chip 101 and the second support member 131. The first electrode pattern P1 may be disposed between the first lead electrode 161 and the second support member 131, and the second electrode pattern P2 may be disposed between the second lead electrode 163 and the second support member 131.

The first and second electrode patterns P1 and P2 may be spaced apart from the top edge of the second support member 131. If the first and second electrode patterns P1 and P2 exist at the top edge, the first and second electrode patterns P1 and P2 may be connected to each other along the top edge as shown in FIG. 1, and therefore, an electrical short circuit may occur.

The fourth metal layer 139 may be spaced apart from a bottom edge of the second support member 131. When the fourth metal layer 139 is an electrical wire, the fourth metal layer 139 may be spaced apart from the bottom edge of the second support member 131 so as to prevent electrical interference therebetween. Accordingly, although electrical patterns using the fourth metal layer 139 of the second support member 131 are designed, it is possible to prevent an electrical short.

The bottom area of the third metal layer 138 may be smaller than the top area of the second support member 131. The top area of the fourth metal layer 139 may be smaller than the bottom area of the second support member 131.

Accordingly, edge portions of the third and fourth metal layers 138 and 139 can be spaced apart from the first support member 110.

The thickness B1 of the first support member B1 may be equal to or thicker than the thickness B2 of the second support member 131. The sum of the thicknesses of the second support member 131 and the third and fourth metal layers 138 and 139 may be equal to the thickness B1 of the first support member 110, but the present disclosure is not limited thereto. The thickness B2 of the second support member 131 is formed thicker than the sum of the thicknesses of the first and second resin layers 111 and 113, and thus a sufficient heat dissipation surface area can be provided.

Meanwhile, the adhesive member 151 is disposed between the first and second support members 110 and 131. The adhesive member 151 is adhered to the first and second support members 110 and 131 while being disposed in the opening 151 of the first support member 110. The adhesive member 151 may contact the first and second resin layers 111 and 113 and the adhesive layer 115. The adhesive member 151 supports the second support member 131 while being disposed in the opening 150 of the first support.

An upper portion of the adhesive member 151 may be disposed between the first and third metal layers 118 and 138. The upper portion of the adhesive member 151 may be disposed at a height equal to or lower than that of the top surface of the first support member 110. If the upper portion of the adhesive member 151 is disposed at a height higher than that of the top surface of the first support member 110, surfaces of the lead electrodes 161 and 163 may be formed to be rough.

A lower portion of the adhesive member 151 may be disposed between the second and fourth metal layers 119 and 139. The lower portion of the adhesive member 151 may be disposed at a height equal to or higher than that of the bottom surface of the first support member 110. If the lower portion of the adhesive member 151 is further protruded than the bottom surface of the first support member 110, a surface of the conductive layer 165 may be formed to be rough.

The adhesive member 151 may be disposed on at least one of the top and bottom surfaces of at least one of the first and second support members 110 and 131. The adhesive member 151 may include any one or both of a first adhesive part 153 disposed at a top edge portion of the second support member 131 and a second adhesive part 155 disposed at a bottom edge portion of the second support member 131. The first and second adhesive parts 153 and 155 may extend or protrude from the adhesive member 151.

The first adhesive part 153 is adhered to the top circumference of the second support member 131, and may be disposed under the circumference of the third metal layer 138 and the lead electrodes 161 and 163. The first adhesive part 153 may be adhered to the second support member 131 and the lead electrodes 161 and 163.

The first adhesive part 153 may also be exposed on the gap 109 as shown in FIG. 1, but the present disclosure is not limited thereto. The thickness of the first adhesive part 153 may be equal to or thinner than that of the third metal layer 138. When the thickness of the first adhesive part 153 is thicker than that of the third metal layer 138, the surfaces of the lead electrodes 161 and 163 are not uniform.

The second adhesive part 155 is adhered to the bottom circumference of the second support member 131, and may be disposed at the circumference of the fourth metal layer 139. The thickness of the second adhesive part 155 may be equal to or thinner than that of the fourth metal layer 139. When the thickness of the second adhesive part 155 is thicker than that of the fourth metal layer 139, the surface of the conductive layer 165 disposed under the second adhesive part 155 is not uniform. The second adhesive part 155 may be adhered to the second support member 131 and the conductive layer 165.

The adhesive member 151 may be made of the same material as the adhesive layer 115, and may include, for example, at least one of silicon, epoxy, and prepreg. As another example, the adhesive member 151 may be formed of a different material from the adhesive layer 115 among the above-described materials.

Meanwhile, the first lead electrode 161 is disposed on the second support member 131, and a portion of the first lead electrode 161 may extend on a second region of the first support member 110, e.g., the third electrode pattern P3 of the first metal layer 118.

The second lead electrode 163 may be disposed on a first region of the first support member 110, e.g., the fourth electrode pattern P4 of the first metal layer 118, and a portion of the second lead electrode 163 may extend on the second electrode pattern P2 of the second support member 131. The first and second regions of the first support member 110 may be different regions from each other.

The first lead electrode 161 may be connected to the first electrode pattern P1 of the third metal layer 138 and the third electrode pattern P3 of the first metal layer 118. The first lead electrode 161 may be disposed to vertically overlap with the second support member 131, the adhesive member 151, and the second region of the first support member 110.

Here, the light emitting chip 101 vertically overlap with the first lead electrode 161 and the second support member 131, and may be bonded to the first lead electrode 161 using a bonding material. When the light emitting chip 101 is bonded to the first lead electrode 161, the bonding material includes a conductive material, e.g., a solder material. When an electrical connection between the light emitting chip 101 and the first lead electrode 161 is not required, the bonding material may be an insulative material, e.g., a silicon or epoxy material.

The second lead electrode 163 may be disposed on the first region of the first support member 110, the adhesive member 151, and the second support member 131. The second lead electrode 163 may be connected to the second electrode pattern P2 of the third metal layer 138 and the fourth electrode pattern P4 of the first metal layer 118.

The first and second lead electrodes 161 and 163 are pads and may include a different metal from the first to fourth metal layers 118, 119, 138, and 139. For example, each of the first and second lead electrodes 161 and 163 may be formed in a single layer or multiple layers using at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof.

A protective layer (not shown) for surface protection may be disposed on the first and second lead electrodes 161 and 163. The protective layer may include a solder resist material.

Meanwhile, the conductive layer 165 is disposed under the second support member 131. The conductive layer 165 dissipates, under the second support member 131, heat conducted from the second support member 131. The conductive layer 165 may extend under the first support member 110. The conductive layer 165 may be disposed under the second and fourth metal layers 119 and 139. The conductive layer 165 is disposed such that its lateral or longitudinal width is wider than the lateral or longitudinal width of the second support member 131, thereby diffusing the conducted heat. A portion of the conductive layer 165 may vertically overlap with the adhesive member 151.

The conductive layer 165 may include a different metal from the first to fourth metal layers 118, 119, 138, and 139. For example, the conductive layer 165 may be formed in a single layer or multiple layers using at least one selected from the group consisting of titanium (Ti), palladium (Pd), copper (Cu), nickel (Ni), gold (Au), chromium (Cr), tantalum (Ta), platinum (Pt), tin (Sn), silver (Ag), and phosphorus (P), or a selective alloy thereof. The conductive layer 165 may include the same metal as the first and second lead electrodes 161 and 163, but the present disclosure is not limited thereto.

The light emitting chip 101 is connected to the first and second lead electrodes 161 and 163. The light emitting chip 101 may be bonded to the first lead electrode 161 using a conductive adhesive, and may be connected to the second lead electrode 163 through the wire 105. The light emitting chip 101 is driven by receiving power supplied from the first and second lead electrodes 161 and 163, to emit light. Heat generated from the light emitting chip 101 may be conducted to the first lead electrode 161, the second support member 131, and the conductive layer 165.

According to an embodiment, the light emitting chip 101 may be disposed in one or plurality on the second support member 131, but the present disclosure is not limited thereto. The plurality of light emitting chips 101 may be connected in series or parallel, but the present disclosure is not limited thereto.

The light emitting device 100 according to the embodiment may exclude a material, e.g., an insulative adhesive, which increases heat resistance between the light emitting chip 101 and the second support member 131 in a region in which the light emitting chip 101 is disposed. In the light emitting device 100 according to the embodiment, the second support member 131 made of a ceramic material is disposed in the region in which the light emitting chip 101 is disposed, thereby improving heat dissipation efficiency. In the light emitting device 100 according to the embodiment, the first support member 110 made of a resin material is disposed at the circumference of the second support member 131, so that an electrical connection to the rear face of the first support member 110 can be easily made through a circuit pattern or via hole on the first support member 110. In addition, other control parts may be further disposed on the first support member 110.

Figure 4:
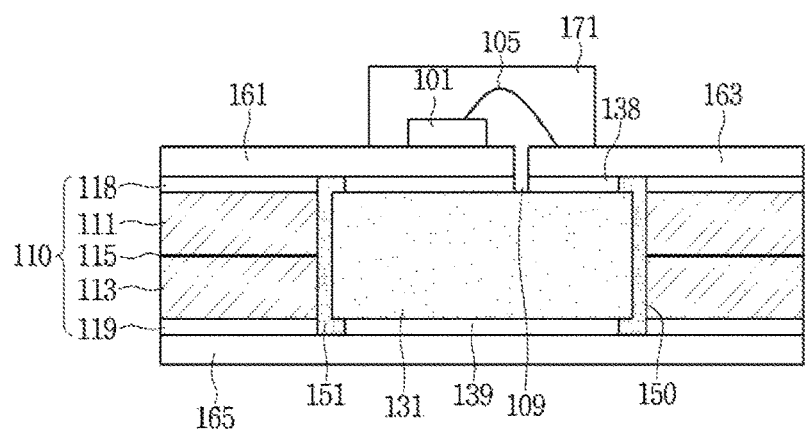
FIG. 4 shows a first modification of the light emitting device of FIG. 2.

FIG. 4 shows a first modification of the light emitting device of FIG. 2. In FIG. 4, components identical to the above-described components refer to the above-described components and their descriptions.

Referring to FIG. 4, the light emitting device includes a light emitting chip 101, a first support member 110 having an opening 150, a second support member 131 located in the opening 150 of the first support member 110, the second support member 131 being disposed under the light emitting chip 101, a first lead electrode 161 disposed between the second support member 131 and the light emitting chip 101, a second lead electrode 163 disposed on at least one of the first and second support members 110 and 131, a conductive layer 165 disposed under the first and second support members 110 and 131, and a light transmission layer 171 disposed over the light emitting chip 101.

The light transmission layer 171 may be disposed on surfaces of the light emitting chip 101, e.g., side and top surfaces of the light emitting chip 101. The light transmission layer 171 may include a resin material such as silicon or epoxy.

A top surface of the light transmission layer 171 may be located at a position higher than the height of the highest point of a wire 105, but the present disclosure is not limited thereto. The light transmission layer 171 may include an impurity such as a fluorescent substance, a dispersing agent, or a scattering agent, but the present disclosure is not limited thereto.

The light transmission layer 171 may vertically overlap with the second support member 131, and a portion of the light transmission layer 171 may be formed in a gap 109 between the first and second lead electrodes 161 and 163. The light transmission layer 171 may be disposed over the second support member 131 and the first support member 110, but the present disclosure is not limited thereto.

Figure 5:
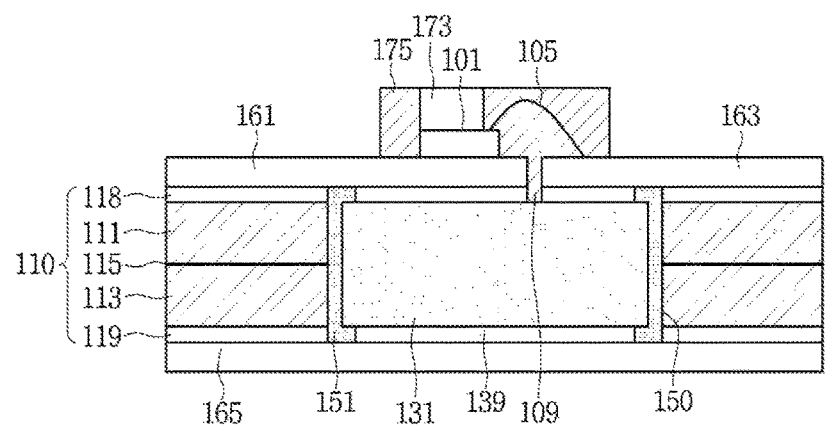
FIG. 5 shows a second modification of the light emitting device of FIG. 2.

FIG. 5 shows a second modification of the light emitting device of FIG. 2. In FIG. 5, components identical to the above-described components refer to the above-described components and their descriptions.

Referring to FIG. 5, the light emitting device includes a light emitting chip 101, a first support member 110 having an opening 150, a second support member 131 located in the opening 150 of the first support member 110, the second support member 131 being disposed under the light emitting chip 101, a first lead electrode 161 disposed between the second support member 131 and the light emitting chip 101, a second lead electrode 163 disposed on at least one of the first and second support members 110 and 131, a conductive layer 165 disposed under the first and second support members 110 and 131, a fluorescent substance layer 173 disposed on the light emitting chip 101, and a reflecting member 175 disposed at the circumferential of the light emitting chip 101.

The fluorescent substance layer 173 is disposed on a top surface of the light emitting chip 101. The fluorescent substance layer 173 may be further formed on side surfaces of the light emitting chip 101, but the present disclosure is not limited thereto.

The fluorescent substance layer 173 converts wavelengths of a portion of light emitted from the light emitting chip 101. The fluorescent substance layer 173 includes a fluorescent substance in a silicon or epoxy resin. The fluorescent substance may include at least one of red, green, blue, and yellow fluorescent substances, but the present disclosure is not limited thereto. The fluorescent substance may be formed of, for example, one selected from the group consisting of YAG, TAG, silicate, nitride, and oxy-nitride-based materials.

The reflecting member 175 may be disposed at the circumference of the light emitting chip 101 and the fluorescent substance layer 173. The reflecting member 175 reflects light incident from the light emitting chip 101, so that light is extracted through the fluorescent substance layer 173.

The reflecting member 175 may include a nonmetallic or insulative material, and may be formed of, for example, a resin material such as silicon or epoxy. The reflecting member 175 may include an impurity having a refractive index higher than that of the resin material. At least one of compounds, such as oxide, nitride, fluoride, and sulfide, having at least one of Al, Cr, Si, Ti, Zn, and Zr, may be added to the reflecting member 175.

A top surface of the reflecting member 175 may be located at a position higher than the height of the highest point of a wire 105. Accordingly, the reflecting member 175 can protect the wire 105.

The reflecting member 175 may be disposed to vertically overlap with the second support member 131, and may contact the first and second lead electrodes 161 and 163. The reflecting member 175 can dissipate heat from its surfaces through thermal conduction performed by the impurity.

According to an embodiment, an optical lens may be disposed on one or a plurality of light emitting chips 101, but the present disclosure is not limited thereto.

Figure 6:
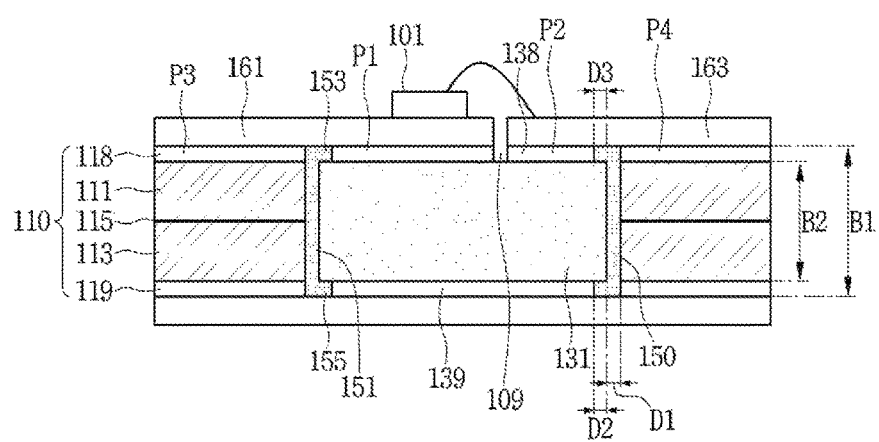
FIG. 6 shows a detailed configuration of an adhesive member of each of the light emitting devices of FIGS. 2, 4, and 5.
Figure 7:
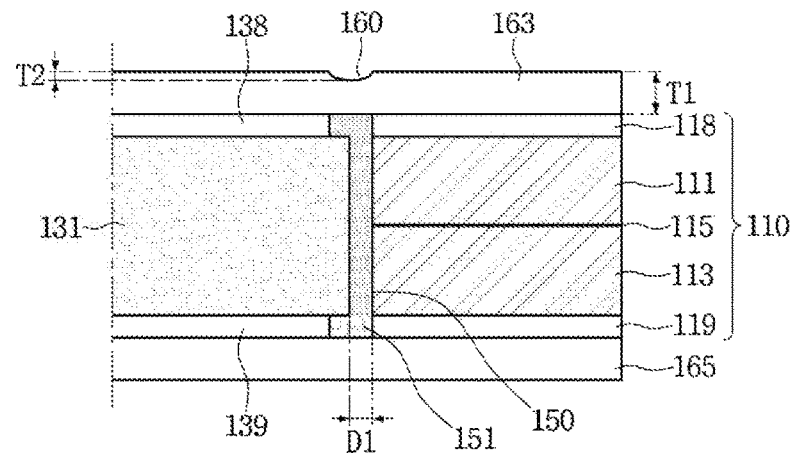
FIG. 7 is a view showing a surface state of a lead electrode located on the adhesive member in each of the light emitting devices of FIGS. 2, 4, and 5.
Figure 8:
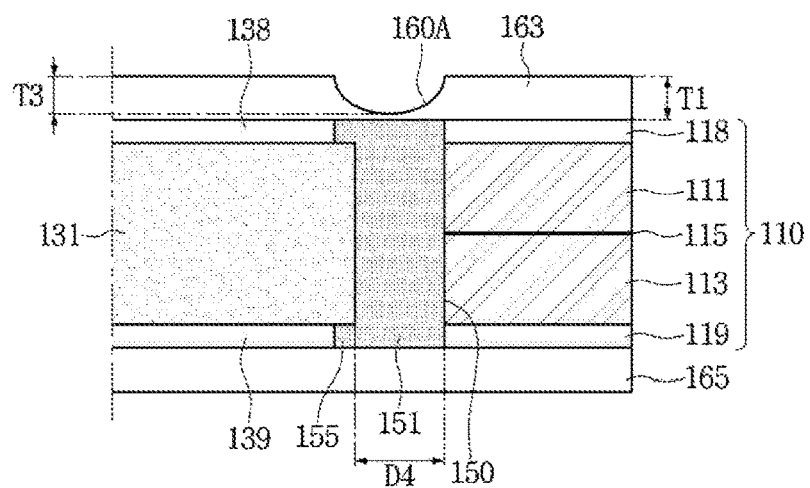
FIG. 8 is a view showing a surface state of the lead electrode as the thickness of the adhesive member increases in each of the light emitting devices of FIGS. 2, 4, and 5.

FIG. 6 shows a detailed configuration of an adhesive member of each of the light emitting devices of FIGS. 2, 4, and 5. FIG. 7 is a view showing a surface state of a lead electrode located on the adhesive member in each of the light emitting devices of FIGS. 2, 4, and 5. FIG. 8 is a view showing a surface state of the lead electrode as the thickness of the adhesive member increases in each of the light emitting devices of FIGS. 2, 4, and 5.

In the light emitting device according to the embodiment, a concave part 160 or 160A may be formed in the lead electrode 163 as shown in FIG. 7 or 8 depending on a thickness D1 of the adhesive member 151 disposed between the first and second support members 110 and 131 as shown in FIG. 6. If the concave part 160A of the lead electrode 163 is formed deeper as shown in FIG. 8, the lead electrode 163 may be open-circuited.

The thickness D1 of the adhesive member 151 may be equal to or smaller than 300 μm, e.g., in a range of 25 μm to 200 μm. When the thickness D1 of the adhesive member 151 is in the range of 25 μm to 200 μm, a fine concave part 160 may formed in the surface of the lead electrode 163 as shown in FIG. 7. The depth T2 of the concave part 160 is formed to be equal to or smaller than ⅓ of the thickness T1 of the lead electrode 163, and therefore, a failure that the lead electrode 163 is open-circuited may not occur.

If the thickness of the adhesive member 151 is less than 25 μm, any stress relief is not made in the direction of the adhesive member 151, and therefore, cracks may be generated in the second support member 131 in a thermal impact test. When the thickness D4 of the adhesive member 151 exceeds 300 μm as shown in FIG. 8, it is difficult to perform surface metal processing, and the lead electrode 163 on the adhesive member 151 has the concave part 160A caving in to a deep depth T3. Therefore, a failure that the lead electrode 163 is open-circuited.

Due to the first adhesive part 153 of the adhesive member 151, it is possible to prevent an electrical short circuit between the electrode patterns P1 and P2 at the top edge of the second support member 131. The first adhesive part 153 may have a width D3 that is equal to or greater than 50 μm, e.g., in a range of 50 μm to 150 μm. When the width D3 of the first adhesive part 153 is smaller than the range, electrical interference may occur between the adjacent patterns P1 and P2. When the width D3 of the first adhesive part 153 is greater than the range, the first adhesive part 153 may have influence on the surfaces of the lead electrodes 161 and 163.

When electrode patterns are formed on the bottom surface of the second support member 131, the second adhesive part 155 can prevent an electrical short-circuit between the electrode patterns on the bottom surface of the second support member 131. The width D2 of the second adhesive part 155 may be formed equal to or wider than the width D3 of the first adhesive part 153, and the second adhesive part 155 may have a width that is equal to or greater than 50 μm, e.g., in a range of 70 μm to 200 μm. When the width D2 of the second adhesive part 155 is smaller than the range, electrical interference may occur between the adjacent patterns P1 and P2. When the width D2 of the second adhesive part 155 is greater than the range, the second adhesive part 155 may have influence on the surface of the conductive layer 165.

FIGS. 9 to 17 are other modifications of the light emitting device of FIG. 2. In FIGS. 9 to 17, components identical to the above-described components refer to the above-described components and their descriptions, and their detailed descriptions will be omitted.

Figure 9:
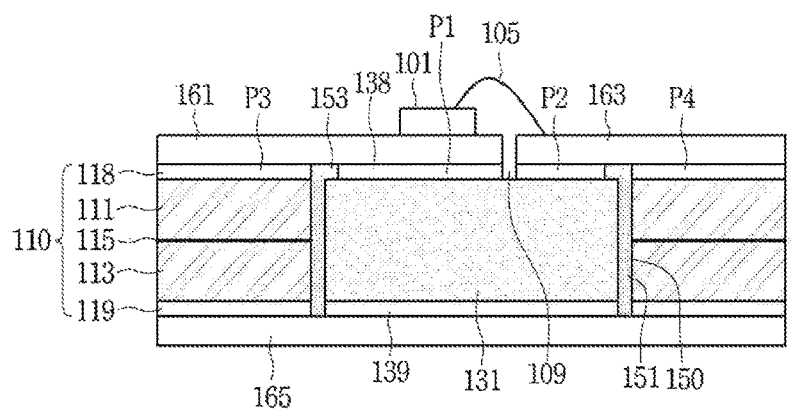
FIG. 9 shows a first modification of the adhesive member of the light emitting device of FIG. 5.

Referring to FIG. 9, an adhesive member 151 is disposed between a first support member 110 and a second support member 131, and includes a first adhesive part 153. The first adhesive part 153 is adhered to a top edge portion of the second support member 131, and is disposed between a third metal layer 138 and a first metal layer 118. The first adhesive part 153 can prevent first and second electrode patterns P1 and P2 from being connected to each other through a region of a gap 109.

The adhesive member 151 does not include a second adhesive part, and a lower portion of the adhesive member 151 may be disposed between a second metal layer 119 and a fourth metal layer 139. In this case, when a conductive layer 165 is not a power supply layer, the fourth metal layer 139 extends up to a region of the second adhesive part, and thus the thermal conduction efficiency caused by the fourth metal layer 139 can be improved.

Figure 10:
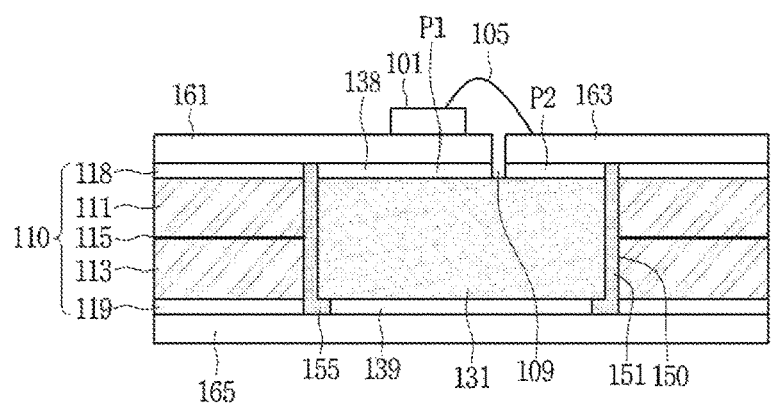
FIG. 10 shows a second modification of the adhesive member of the light emitting device of FIG. 5.

Referring to FIG. 10, an adhesive member 151 has a structure including a second adhesive part 155 without any first adhesive part. When a conductive layer 165 is a power supply layer, the second adhesive part 155 can prevent an electrical short circuit between electrode patterns of a fourth metal layer 139 at a bottom edge portion of a second support member 131.

An upper portion of the adhesive member 151 may be disposed between a third metal layer 138 and a first metal layer 118, and a gap 109 may divide the third metal layer 138 into a first pattern P1 and a second pattern P2 on the second support member 131. Accordingly, although the first adhesive part of the adhesive member 151 is removed, the gap 109 can prevent an electrical short circuit on the second support member 131.

Figure 11:
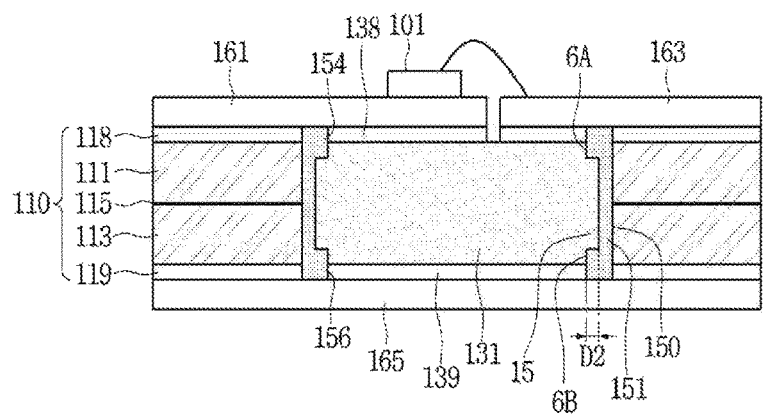
FIG. 11 shows a third modification of the adhesive member of the light emitting device of FIG. 5.

Referring to FIG. 11, a second support member 131 includes at least one of a first recess 6A disposed at a top edge thereof and a second recess 6B disposed at a bottom edge thereof. The first recess 6A may be disposed along the top edge of the second support member 131, and may be formed to be stepped from a top surface of the second support member 131. The second recess 6B may be formed along the bottom edge of the second support member 131, and may be formed to be stepped from a bottom surface of the second support member 131.

An adhesive member 151 is disposed between a first support member 110 and the second support member 131. A first adhesive part 154 may be disposed in the first recess 6A, and a second adhesive part 155 may be disposed in the second recess 6B.

The first adhesive part 154 may be disposed between a third metal layer 138 and a first metal layer 118, and the second adhesive part 155 may be disposed between a second metal layer 119 and a fourth metal layer 139. The first adhesive part 154 may have an increased adhesion area, and thus it is possible to prevent the occurrence of a short circuit on a top surface of the second support member 131.

The width of the first and second recesses 6A and 6B may be equal to that of the first and second adhesive parts 154 and 155, and may be, for example, in a range of 25 µm to 300 µm. By using the width of the first and second recesses 6A and 6B, it is possible to prevent interference between adjacent electrode patterns.

Figure 12:
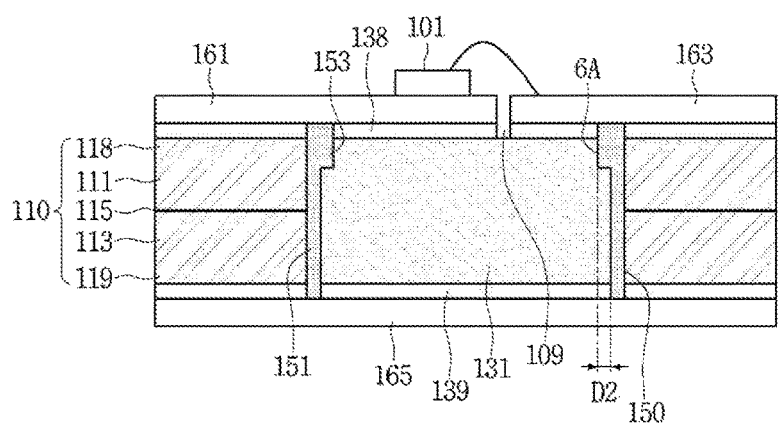
FIG. 12 shows a fourth modification of the adhesive member of the light emitting device of FIG. 5.

Referring to FIG. 12, a second support member 131 includes a first recess 6A disposed at an upper circumference thereof, and a second recess disposed at a lower circumference of the second support member 131 may be omitted. A first adhesive part 153 is disposed in the first recess 6A, and thus it is possible to prevent the occurrence of a short circuit at an upper portion of the second support member 131. Further, it is possible to improve the adhesion area between lead electrodes 161 and 163.

Figure 13:
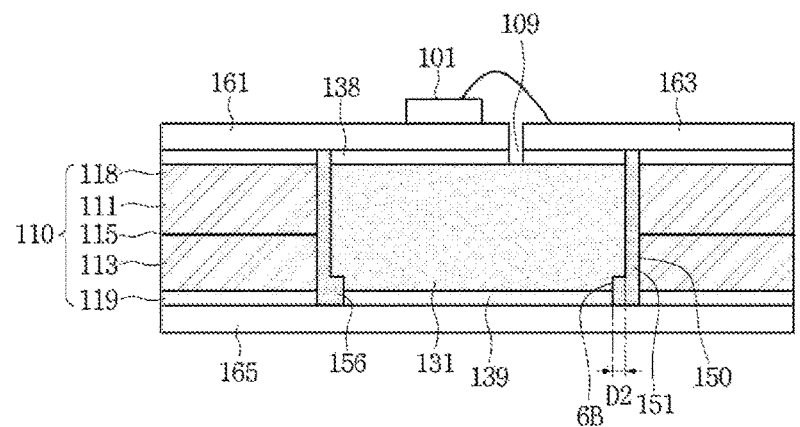
FIG. 13 shows a fifth modification of the adhesive member of the light emitting device of FIG. 5.

Referring to FIG. 13, a second recess 6B is disposed at a lower circumference of a second support member 131, and a first recess disposed at an upper circumference of the second support member 131 may be omitted. A second adhesive part 155 is disposed in the second recess 6B, and thus it is possible to prevent the occurrence of a short circuit at a lower portion of the second support member 131. Further, it is possible to improve the adhesion area with a conductive layer 165.

Figure 14:
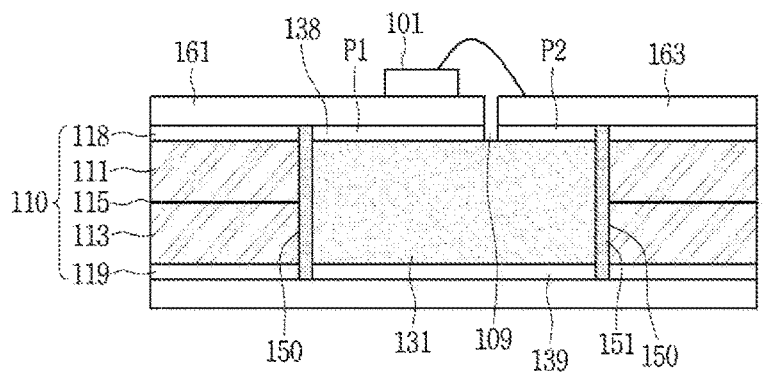
FIG. 14 shows a sixth modification of the adhesive member of the light emitting device of FIG. 5.

Referring to FIG. 14, an adhesive member 151 is disposed between first and second support members 110 and 131 in an opening 150 of the first support member 110. An upper portion of the adhesive member 151 may be disposed in a region between first and third metal layers 118 and 138 and under first and second lead electrodes 161 and 163. The upper portion of the adhesive member 151 does not include any separate adhesive part, and thus a gap 109 can separate electrode patterns P1 and P2 of the third metal layer 138 from each other.

A lower portion of the adhesive member 151 may be disposed in a region between second and fourth metal layers 119 and 139 and on a conductive layer 165.

Figure 15:
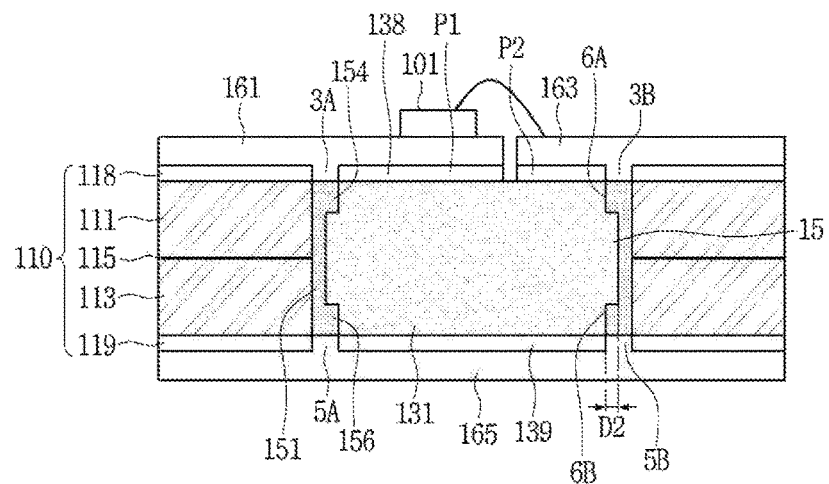
FIG. 15 shows a seventh modification of the adhesive member of the light emitting device of FIG. 5.

Referring to FIG. 15, an adhesive member 151 is adhered between first and second support members 110 and 131, and a first recess 6A is disposed at an upper circumference of the second support member 131. A first adhesive part 154 of the adhesive member 151 may be disposed in the first recess 6A. A second recess 6B is disposed at a lower circumference of the second support member 131, and a second adhesive part 156 of the adhesive member 151 may be disposed in the second recess 6B. A protruding part 15 is disposed between the first and second recesses 6A and 6B.

Here, unlike FIG. 11, the adhesive member 151 may not protrude upward of a top surface of the second support member 131 and downward of a bottom surface of the second support member 131. Accordingly, projections 3A and 3B of first and second lead electrodes 161 and 163 protrude to a region between first and third metal layers 118 and 138 to be adhered to the first adhesive part 154. Projections 5A and 5B of a conductive layer 165 protrude to a region between second and fourth metal layers 119 and 139 to be adhered to the second adhesive part 156. In the light emitting device, although the first adhesive part 154 does not protrude upward of the top surface of the second support member 131, it is possible to prevent an electrical short circuit caused by a gap 109.

Figure 16:
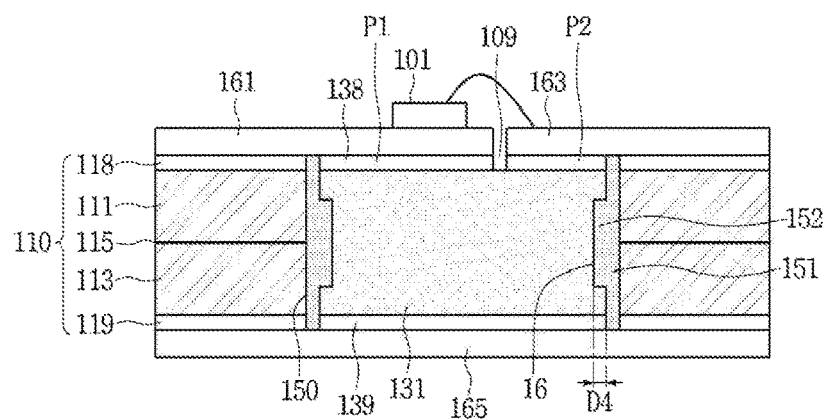
FIG. 16 shows an eighth modification of the adhesive member of the light emitting device of FIG. 5.

Referring to FIG. 16, an adhesive member 151 may be disposed between first and second support members 110 and 131. A groove 16 depressed inward of a side surface of the second support member 131, and a protruding part 152 of the adhesive member 151 may be disposed in the groove 16. The depth of the groove 16 may be formed within a range in which heat dissipation efficiency is not degraded and the strength of the second support member 131 is not degraded.

An upper portion of the adhesive member 151 may protrude upward of a top surface of the second support member 131, and a lower portion of the adhesive member 151 may protrude downward of a bottom surface of the second support member 131.

Figure 17:
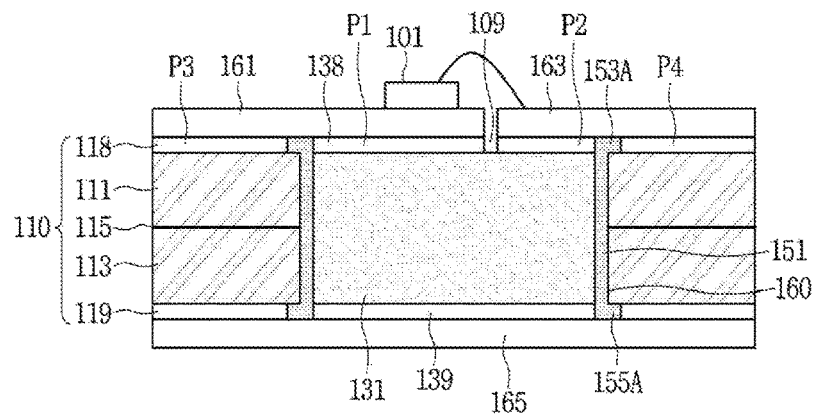
FIG. 17 shows a ninth modification of the adhesive member of the light emitting device of FIG. 5.

Referring to FIG. 17, an adhesive member 151 is disposed between first and second support members 110 and 131, and may include at least one or both of a first adhesive part 153A extending to a top inside of the first support member 131 and a second adhesive part 155A extending to a bottom inside of the first support member 131. The first adhesive part 153A may extend to a region adjacent to an opening in a top surface of the first support member 110, to be disposed between first and third metal layers 118 and 138. The second adhesive part 155A may extend to a region adjacent to the opening 150 in a bottom surface of the first support member 131, to be disposed between second and fourth metal layers 119 and 139.

In the light emitting device, the first and second adhesive parts 153A and 155A of the adhesive member 151 are not disposed on the second support member 131 but disposed on the first support member 110, thereby improving the heat dissipation surface area of the second support member 131.

The third metal layer 138 on the second support member 131 may be divided into predetermined electrode patterns P1 and P2 by a gap 109. Accordingly, it is possible to prevent the occurrence of a short circuit between the electrode patterns P1 and P2 on the second support member 131.

Figure 18:
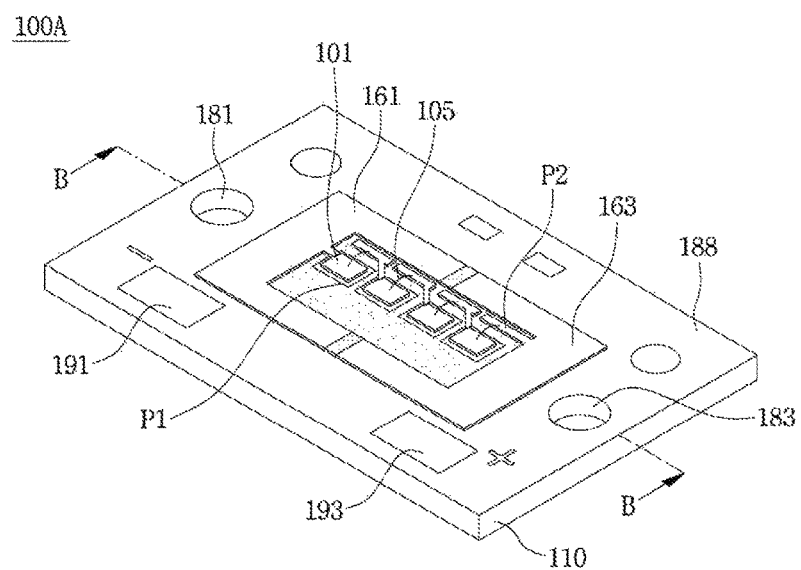
FIG. 18 is a view showing a lighting module having a light emitting device according to a second embodiment.
Figure 19:
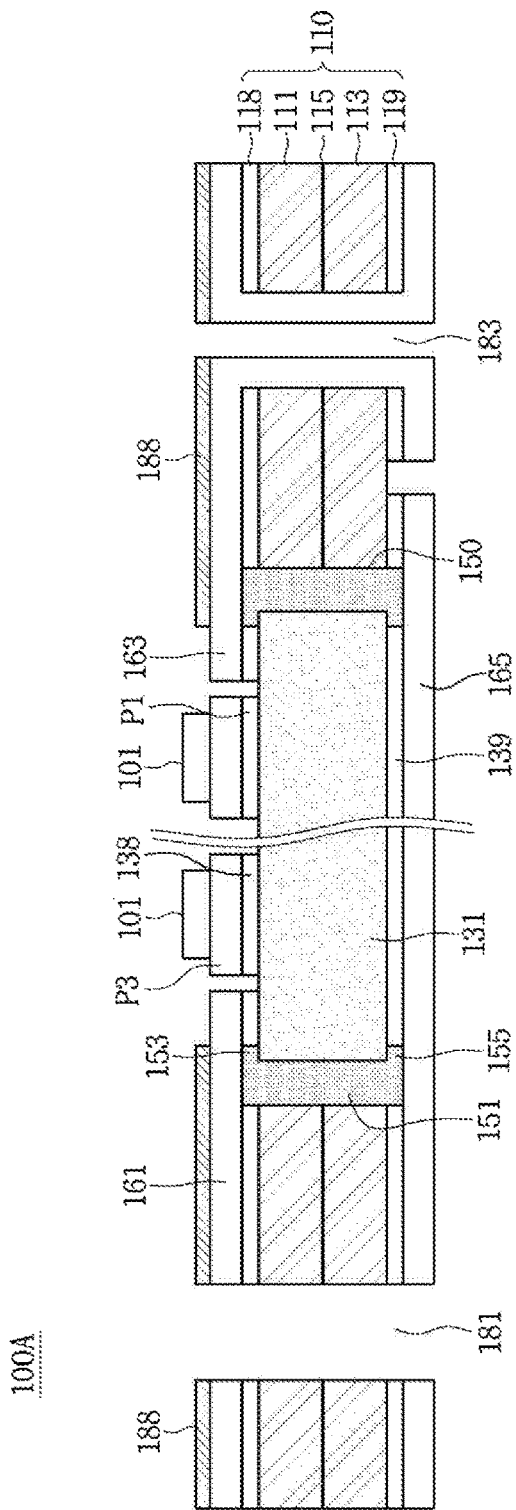
FIG. 19 is a side sectional view of the lighting module of FIG. 18.

FIG. 18 is a view showing a lighting module having a light emitting device according to a second embodiment. FIG. 19 is a sectional view taken along line B-B of the lighting module of FIG. 18. In FIGS. 18 and 19, components identical to the above-described components refer to the above-described components and their descriptions.

Referring to FIGS. 18 and 19, the lighting module 100A includes a plurality of light emitting chips 101, a first support member 110 having an opening 150, a second support member 131 located in the opening 150 of the first support member 110, the second support member 131 being disposed under the light emitting chips 101, a first lead electrode 161 disposed on the second support member 131, the first lead electrode 161 being connected to the light emitting chips 101, a second lead electrode 163 disposed on at least one of the first and second support members 110 and 131, and a conductive layer 165 disposed under the first and second support members 110 and 131. According to an embodiment, an optical lens may be disposed over the plurality of light emitting chips 101, but the present disclosure is not limited thereto.

The first and second support members 110 and 131 may be formed of the same material as the above-described material.

An adhesive member 151 is disposed between the first and second support members 110 and 131, and may allow the first and second support members 110 and 131 to be adhered to each other therethrough.

A first metal layer 118 may be disposed on a top surface of the first support member 110, and a second metal layer 119 may be disposed on a bottom surface of the first support member 110. Each of the first and second metal layers 118 and 119 may be divided into one or a plurality of regions as one or plurality of electrode patterns.

A plurality of electrode patterns P1 and P2 may be disposed on the second support member 131 depending on a pattern shape of a third metal layer 138. The light emitting chips 101 may be respectively disposed on first electrode patterns P1 among the plurality of electrode patterns P1 and P2, and the first electrode patterns P1 may be electrically connected to the respective light emitting chips 101. A second electrode pattern P2 among the plurality of electrode patterns P1 and P2 may be connected to any one of the first electrode patterns P1 through a wire 105. The plurality of light emitting chips 101 may be connected in series or parallel by the plurality of electrode patterns P1 and P2 on the second support member 131.

The first lead electrode 161 disposed on the second support member 131 may extend on a second region of the first support member 110. The second lead electrode 163 may extend from a first region of the first support member 110 to the top surface of the first support member 110. The first and second lead electrodes 161 and 163 may be selectively connected to the electrode patterns P1 and P2.

Electrode terminals 191 and 193 may be formed on the first support member 110, and at least one hole 181 or at least one via hole 183 may be disposed in a predetermined region.

A conductive layer 165 is disposed under the second support member 131. The conductive layer 165 may extend under the first support member 110. The conductive layer 165 dissipates heat conducted from the second support member 131.

A protective layer 188 may be formed on the first and second lead electrodes 161 and 163. The protective layer 188 protects the first and second lead electrodes 161 and 163, and may be formed of a solder resist material.

Figure 20:
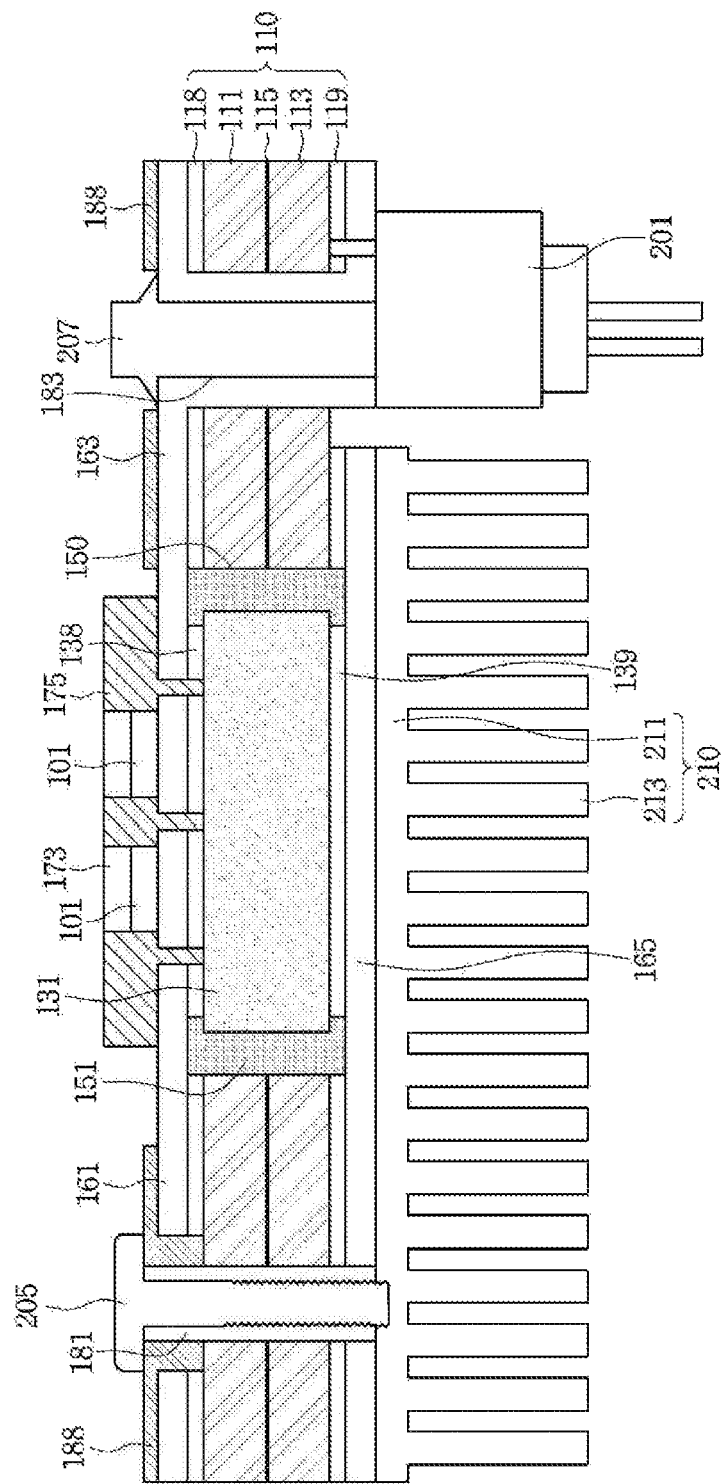
FIG. 20 shows a first modification of the lighting module of FIG. 18.
Figure 21:
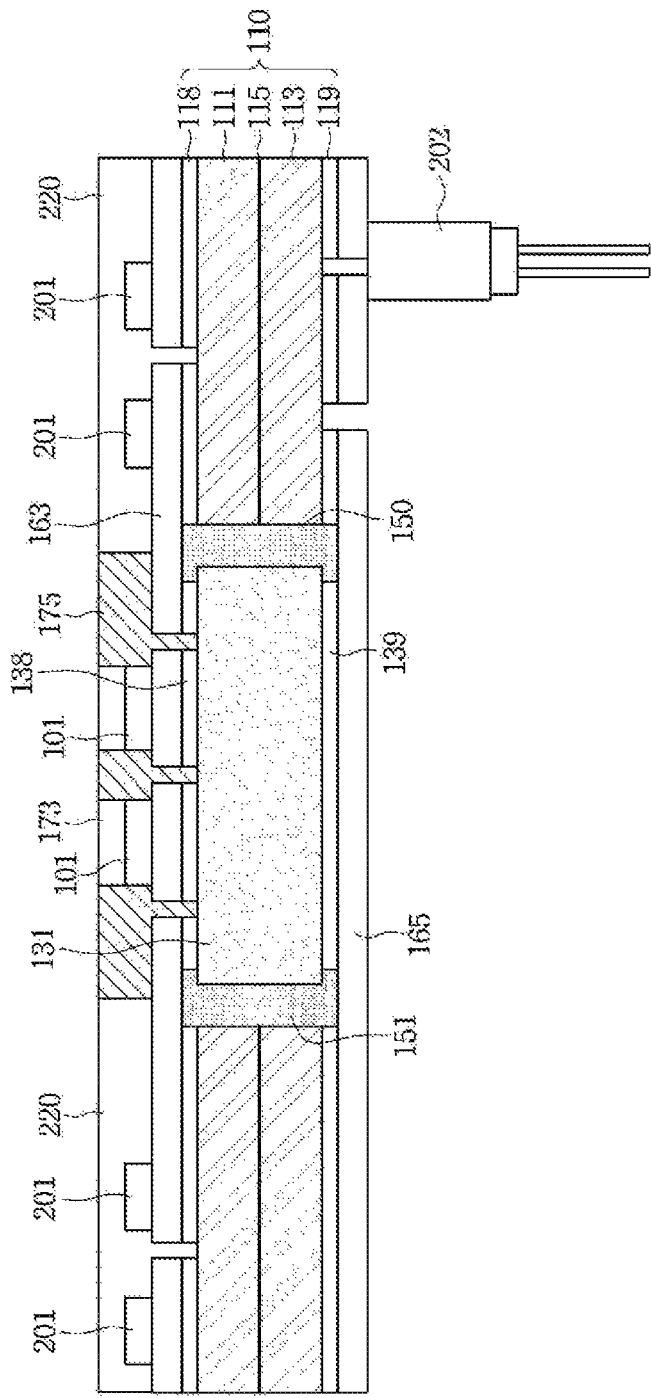
FIG. 21 shows a second modification of the lighting module of FIG. 18.

FIGS. 20 and 21 show other examples of the lighting module of FIG. 19.

Referring to FIG. 20, a lighting module further includes a lower heat dissipation plate 210. The heat dissipation plate 210 may be connected to a conductive layer 165 disposed under first and second support members 110 and 131. The heat dissipation plate 210 includes an upper plate 211 and lower heat dissipation fins 213. The upper plate 213 may be adhered to the conductive layer 165 using an adhesive, or may be fastened to a fastening member 205 through a hole 181 of the first support member 110.

A connector terminal 207 is inserted into a via hole 183 to be connected, and the connector 201 may be electrically connected to the second lead electrode 163.

A fluorescent substance layer 173 is disposed on a light emitting chip 101. The fluorescent substance layer 173 converts wavelengths of a portion of light emitted from the light emitting chip 101. A reflecting member 175 may be disposed at the circumference of the light emitting chip 101. The reflecting member 175 reflects light emitted in the side direction of the light emitting chip 101 to be extracted through the fluorescent substance layer 173.

Referring to FIG. 21, a lighting module may include control parts 201 disposed on at least one of first and second lead electrodes 161 and 163 of a first support member 110. The control parts 201 may be passive or active elements for controlling the driving of a plurality of light emitting chips 101, but the present disclosure is not limited thereto.

A protecting member 220 may be disposed over the control parts 201. The protecting member 220 may include an insulative material, e.g., an epoxy or silicon material.

A connector 202 may be connected to the lighting module, but the present disclosure is not limited thereto.

FIGS. 22 to 28 are views showing a manufacturing process of the light emitting device of FIG. 2.

Figure 22:
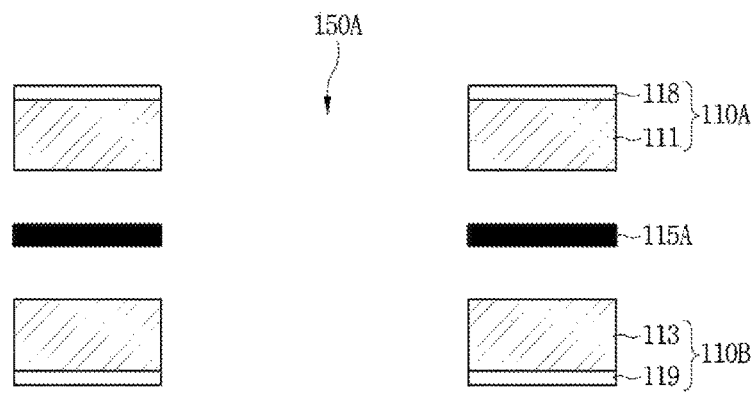
FIGS. 22 to 28 are views showing a manufacturing process of the light emitting device of FIG. 2.
Figure 23:
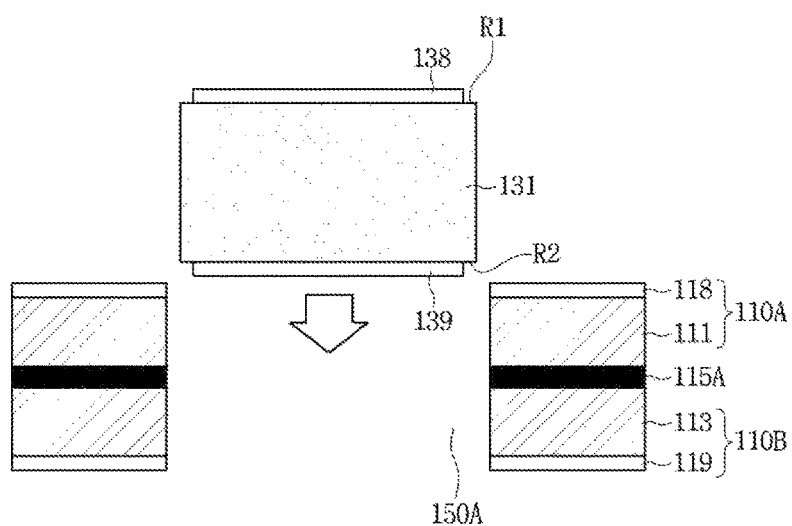

Referring to FIGS. 22 and 23, an opening 150A is formed in a first resin substrate 110A, an adhesive layer 115, and a second resin substrate 110B, and the first resin substrate 110A, the adhesive layer 115, and the second resin substrate 110B are then aligned. The first resin substrate 110A may include a first resin layer 111 and a first metal layer 118 disposed on the first resin layer 111. The second resin substrate 110B may include a second resin layer 113 and a second metal layer 119 disposed under the second resin layer 113.

The adhesive layer 115 is located between the first and second resin substrates 110A and 110B, and the first and second resin substrates 110A and 110B are then adhered to each other through the adhesive layer 115. Accordingly, the first and second resin substrates 110A and 110B can be formed as a first support member 110 as shown in FIG. 24.

In addition, a second support member 131 is located and then inserted into the opening 150A. The second support member 131 includes a ceramic material, and a metal layer 138 and 139 may be disposed on at least one of top and bottom surfaces of the second support member 131. The metal layer 138 and 139 of the second support member 131 may include electrode patterns, but the present disclosure is not limited thereto.

Top and bottom edge portions R1 and R2 of the second support member 131 may be regions in which third and fourth metal layers 138 and 139 are not formed, respectively, but the present disclosure is not limited thereto.

Figure 24:
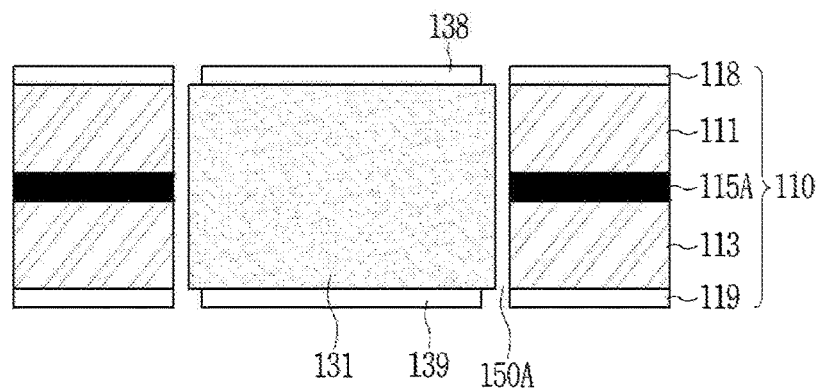
Figure 25:
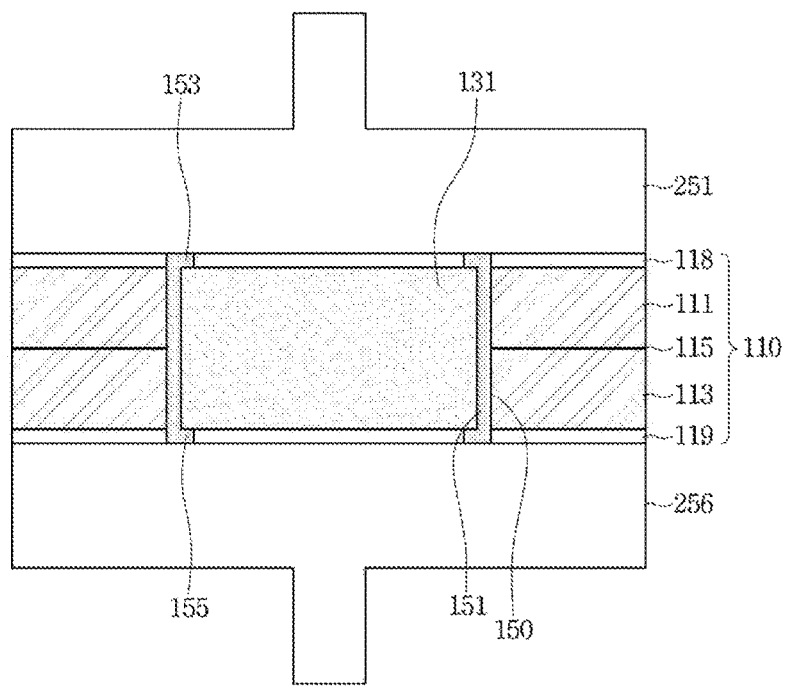

If the second support member 131 is disposed in the opening 150A of the first support member 110 as shown in FIG. 24, the top/bottom of the first and second support members 110 and 131 are compressed using top/bottom compression plates 251 and 156, respectively, as shown in FIG. 25.

At this time, the adhesive layer 115 disposed between the first and second resin layers 111 and 113 is compressed, to move into the opening 150, as shown in FIG. 25. An adhesive material moved into the opening 150 adheres, as an adhesive member 151, the first and second support members 110 and 131 to each other.

The adhesive member 151 extends to the top and bottom edge portions of the second support member 131, to form first and second adhesive portions 153 and 155.

Figure 26:
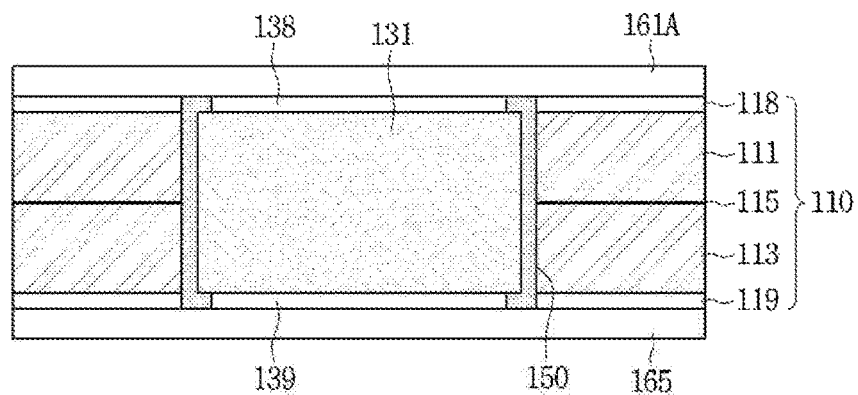

Referring to FIG. 26, a lead electrode 161A and a conductive layer 165 are respectively formed on top and bottoms surfaces of the first and second support members 110 and 131 through a plating process. The lead electrode 161A may be formed in the entire region of the top surfaces of the first and second support members 110 and 131, or may be selectively formed on the top surfaces of the first and second support members 110 and 131.

Here, a hole or a via hole may be formed in the first support member 110 before the plate processing, but the present disclosure is not limited thereto.

Figure 27:
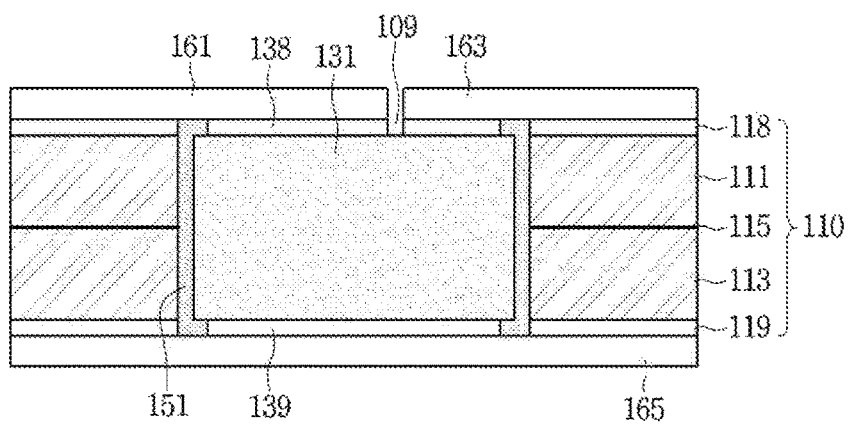

Referring to FIGS. 26 and 27, in order to form patterns, the lead electrode 161A is etched, to form a gap 109, thereby dividing the lead electrode 161 into a plurality of lead electrodes 161 and 163. Also, the conductive layer 165 may be etched in a required pattern shape through an etching process, but the present disclosure is not limited thereto.

Figure 28:
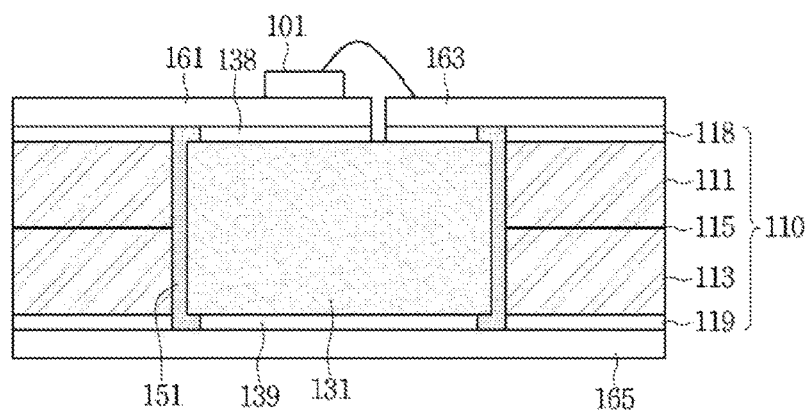

Referring to FIG. 28, a light emitting chip 101 is disposed on a first lead electrode 161 disposed on the second support member 131. The light emitting chip 101 may be bonded to the first lead electrode 161 using a bonding material, and may be electrically connected to the first and second lead electrodes 161 and 163.

Although a case where the light emitting chip 101 is a vertical type chip has been illustrated as an example, the light emitting chip 101 may be a horizontal type chip, but the present disclosure is not limited thereto. Also, the light emitting chip 101 may be mounted in a flip-chip manner, but the present disclosure is not limited thereto.

A fluorescent substance layer or a light transmission layer may be disposed on the light emitting chip 101, and a reflecting member may be disposed at the circumference of the light emitting chip 101. However, the present disclosure is not limited thereto.

Figure 29:
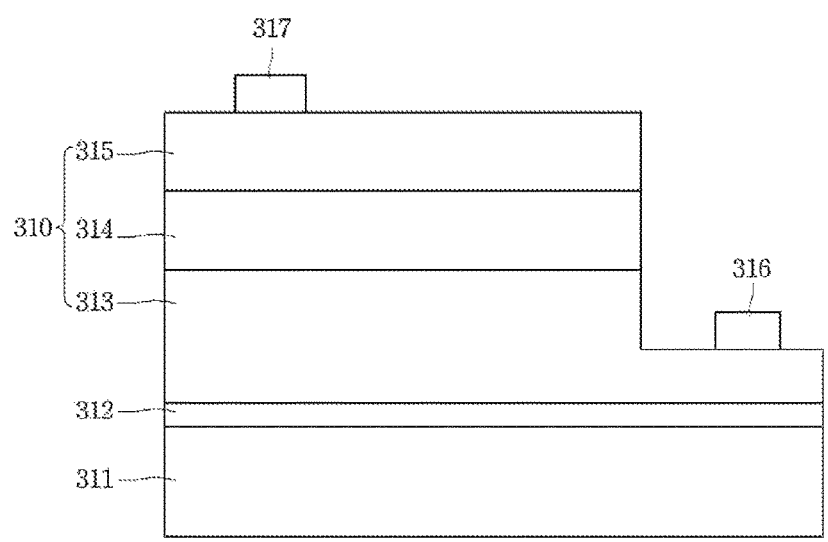
FIG. 29 is a view showing an example of a light emitting chip according to an embodiment.

FIG. 29 is a side sectional view showing an example of a horizontal type light emitting chip according to an embodiment.

Referring to FIG. 29, the light emitting chip includes a substrate 311, a buffer layer 312, a light emitting structure 310, a first electrode 316, and a second electrode 317. The substrate 311 includes a substrate made of a light transmissive or non-light transmissive material. Also, the substrate 311 includes a conductive or insulative substrate.

The buffer layer 312 reduces a difference in lattice constant between materials of the substrate 311 and the light emitting structure 310, and may be formed of a nitride semiconductor. A nitride semiconductor layer undoped with a dopant may be further formed between the buffer layer 312 and the light emitting structure 310, thereby improving crystal quality.

The light emitting structure 310 includes a first conductive semiconductor layer 313, an active layer 314, and a second conductive semiconductor layer 315.

The first conductivity type semiconductor layer 313 is implemented using a Group III-V compound semiconductor. The first conductive semiconductor layer 313 includes a semiconductor doped with a first conductive dopant, e.g., a compositional formula of $In_xAl_yGa_{1-x-y}N$ ($0 \leq x \leq 1$, $0 \leq y \leq 1$, $0 \leq x+y \leq 1$). The first conductive semiconductor layer 313 may include a stack structure of layers including at least one of compound semiconductors such as GaN, InN, AlN, InGaN, AlGaN, InAlGaN, AlInN, AlGaAs, GaP, GaAs, GaAsP, and AlGaInP. The first conductive semiconductor layer 313 is an n-type semiconductor layer, and the first conductive dopant may include, as an n-type dopant, Si, Ge, Sn, Se, and Te.

A first clad layer may be formed between the first conductive semiconductor layer 313 and the active layer 314. The first clad layer may be formed of a GaN-based semiconductor, and the bandgap of the first clad layer may be formed equal to or greater than that of the active layer 314. The first clad layer is formed of a first conductive type, and functions to restrain carriers.

The active layer 314 is disposed on the first conductive semiconductor layer 313, and selectively includes a single quantum well structure, a multiple quantum well (MQW) structure, a quantum wire structure or a quantum dot structure. The active layer 314 includes a period of a well layer and a barrier layer. The well layer may include a compositional formula of $In_xAl_yGa_{1-x-y}N$ ($0 \leq x \leq 1$, $0 \leq y \leq 1$, $0 \leq x+y \leq 1$), and the barrier layer may include a compositional formula of $In_xAl_yGa_{1-x-y}N$ ($0 \leq x \leq 1$, $0 \leq y \leq 1$, $0 \leq x+y \leq 1$). For example, the well/barrier layers may repeat with the periodicity of one or more by using a stack structure of InGaN/GaN, AlGaN/GaN, InGaN/AlGaN, InGaN/InGaN, InAlGaN/AlGaN, or InAlGaN/InAlGaN. The barrier layer may be formed of a semiconductor material having a bandgap higher than that of the well layer.

The second conductive semiconductor layer 315 is formed on the active layer 314. The second conductive semiconductor layer 315 includes a semiconductor doped with a second conductive dopant, e.g., a compositional formula of $In_xAl_yGa_{1-x-y}N$ ($0 \leq x \leq 1$, $0 \leq y \leq 1$, $0 \leq x+y \leq 1$). The second conductive semiconductor layer 315 may be made of any one of compound semiconductors such as GaN, InN, AlN, InGaN, AlGaN, InAlGaN, AlInN, AlGaAs, GaP, GaAs, GaAsP, and AlGaInP. The second conductive semiconductor layer 315 is a p-type semiconductor layer, and the second conductive dopant may include, as a p-type dopant, Mg, Zn, Ca, Sr, and Ba.

The second conductive semiconductor layer 315 may include a superlattice structure, and the superlattice structure may include a superlattice structure of InGaN/GaN or AlGaN/GaN. The superlattice structure of the second conductive semiconductor layer 315 diffuses a current included in an abnormal voltage, to protect the active layer 314.

Further, a conductive type of the light emitting structure 310 may be inversely disposed. For example, the first conductive semiconductor layer 313 may be prepared as the p type semiconductor layer, and the second conductive semiconductor layer 315 may be prepared as the n type semiconductor layer. In addition, a first conductive semiconductor layer having polarity opposite to the second conductive type may be further disposed on the second conductive semiconductor layer 315.

The light emitting structure 310 may have one of an n-p junction structure, a p-n junction structure, an n-p-n junction structure, and a p-n-p junction structure. Here, the p is a p type semiconductor layer, the n is an n type semiconductor layer, and the "-" denotes a structure that a p type semiconductor layer and an n type semiconductor layer make direct or indirect contact with each other. Hereinafter, for convenience of description, the uppermost layer of the light emitting structure 310 will be described as the second conductive semiconductor layer 315.

The first electrode 316 is disposed on the first conductive semiconductor layer 313. The second electrode 317 having a current diffusion layer is disposed on the second conductive semiconductor layer 315.

Figure 30:
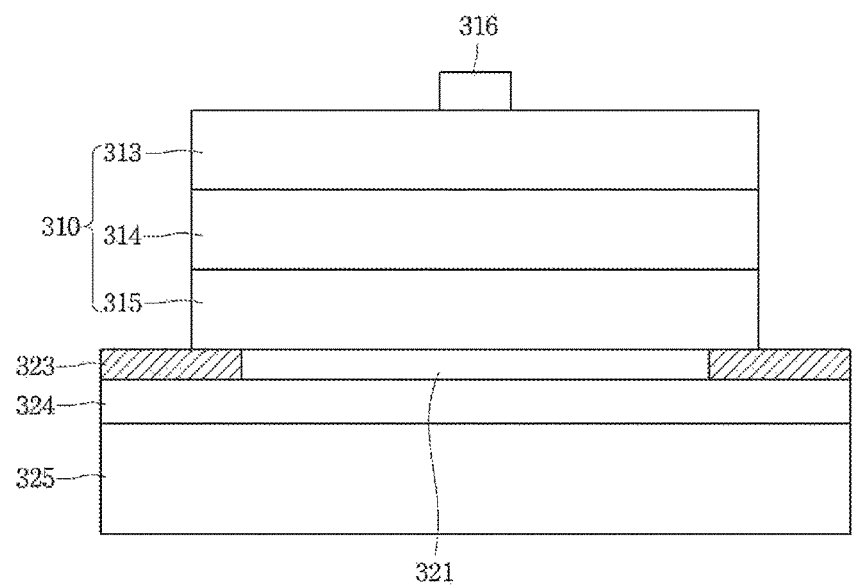
FIG. 30 is a view showing another example of the light emitting chip according to the embodiment.

FIG. 30 is a view showing another example of the light emitting chip according to the embodiment. In FIG. 30, descriptions of portions identical to those of FIG. 29 are omitted and will be briefly described.

Referring to FIG. 30, in a vertical type light emitting chip, a contact layer 321 is formed under a light emitting structure 310, and a reflective layer 324 is formed under the contact layer 321. A support member 325 is formed under the reflective layer 324, and a protective layer 323 may be formed at circumferences of the reflective layer 324 and the light emitting structure 310.

The light emitting chip may be formed by forming the contact layer 321 and the protective layer 323, the reflective layer 324, and the support member 325 under a second conductive semiconductor layer 315 and then removing a growth substrate.

The contact layer 321 comes in ohmic contact with a bottom layer of the light emitting structure 310, e.g., the second conductive semiconductor layer 315. A material of the contact layer 321 may be selected from a metal oxide material, a metal nitride material, an insulative material, and a conductive material. For example, the material of the contact layer 321 may be formed of a material selected from the group consisting of indium tin oxide (ITO), indium zinc oxide (WO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, and the selective combination thereof. Further, the material of the contact layer 321 may be formed in a multiple layer using the above metal and a light-transmissive conductive material such as IZO, IZTO, IAZO, IGZO, IGTO, AZO, and ATO. For example, the material of the contact layer 321 may be stacked in a structure such as IZO/Ni, AZO/Ag, IZO/Ag/ Ni, or AZO/Ag/Ni. A layer for blocking a current to correspond to an electrode 316 may be further formed inside the contact layer 321.

The protective layer 323 may be selectively formed of a metal oxide material or an insulative material. For example, the protective layer may be formed of one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 323 may be formed using a sputtering technique or a deposition technique, and a metal such as the reflective electrode layer 324 can prevent layers of the light emitting structure 310 from being short circuited.

The reflective layer 324 may be formed of a material, e.g., a material selected from the group consisting of Ag, Ni, Al, Rh, Pd, Ir, Ru, Mg, Zn, Pt, Au and Hf, and the selective combination thereof. The reflective layer 324 may be formed in a size larger than a width of the light emitting structure 310, which can improve light reflection efficiency. A metal layer for conjunction and a metal layer for thermal diffusion may be further disposed between the reflective layer 324 and the support member 325, but the present disclosure is not limited thereto.

The support member 325 is a base substrate, and may be formed of a metal such as copper (Cu), gold (Au), nickel (Ni), molybdenum (Mo) or copper-tungsten (Cu—W) or a carrier wafer (e.g., Si, Ge, GaAs, ZnO, SiC). A conjunction layer may be further formed between the support member 325 and the reflective layer 324. The conjunction layer can allow two layers to be adhered to each other. The above-described light emitting chip is and example, and is not limited to the above-described characteristics. The light emitting chip may be selectively applied to the embodiments of the light emitting device, but the present disclosure is not limited thereto.

The embodiments provide a light emitting device having a new heat dissipation structure. The embodiments provide a light emitting device in which a second support member made of a ceramic material, on which a light emitting chip is disposed, is disposed in an opening of a first support member made of a resin material. In the embodiments, metal layers are respectively disposed on top and bottom surfaces of a support member made of a ceramic material, on which a light emitting chip is disposed, thereby improving heat dissipation efficiency. The embodiments provide a light emitting device having improved heat dissipation efficiency. In the embodiments, a support member made of a ceramic material is disposed in an opening of a support member made of a resin material, so that a light emitting device can have a slim thickness. In the embodiments, it is possible to improve the reliability of a light emitting device and a lighting module having the same.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first support member having an opening;
   a second support member disposed in the opening of the first support member;
   an adhesive member disposed between the first and second support members;
   a first lead electrode disposed on the first support member and a first region of the second support member;
   a second lead electrode disposed on the first support member and a second region of the second support member;
   a light emitting chip on the first lead electrode; and
   a recess on a top surface of the second lead electrode,
   wherein the first support member comprises a resin material,
   wherein the second support member comprises a material having a higher thermal conductivity than a thermal conductivity of the resin material,
   wherein the recess overlaps the adhesive member in a vertical direction,
   wherein the light emitting chip is electrically connected to the first lead electrode and the second lead electrode,
   wherein the light emitting chip overlaps the second support member and the first lead electrode in the vertical direction,
   wherein the recess overlaps a region between the first support member and the second support member in the vertical direction, and
   wherein the recess is spaced apart from a region of the first lead electrode on which the light emitting chip is disposed.

2. The light emitting device according to claim 1,
   wherein the first support member comprises:
   a resin member;
   a first metal layer between a top surface of the resin member and the second lead electrode; and
   a second metal layer on a bottom surface of the resin member, and
   wherein the adhesive member contacts the resin member and the first and second metal layers.

3. The light emitting device according to claim 2,
   wherein the resin member comprises:
   a first resin layer between the first metal layer and the second metal layer;
   a second resin layer between the first resin layer and the second metal layer; and
   an adhesive layer between the first resin layer and the second resin layer.

4. The light emitting device according to claim 3,
   wherein the adhesive layer contacts the adhesive member, and
   wherein the adhesive layer and the adhesive member comprise same material.

5. The light emitting device according to claim 3, wherein the recess has a concave surface from the top surface of the second lead electrode.

6. The light emitting device according to claim 1,
   wherein a depth of the recess is formed to be equal to or smaller than ⅓ of the thickness of the second lead electrode.

7. The light emitting device according to claim 3, further comprising:
   a third metal layer between the second support member and the first lead electrode; and a fourth metal layer under a bottom surface of the second support member, wherein the second support member comprises a ceramic material, and wherein a thickness of the second support member is thicker than the thickness of the first resin layer or the thickness of the second resin layer.

8. The light emitting device according to claim 7, wherein a first portion of the adhesive member contacts the first metal layer and the third metal layer, and wherein the first portion of the adhesive member is disposed between the first metal layer and the third metal layer.

9. The light emitting device according to claim 8, wherein the recess has a concave curved surface toward the first portion of the adhesive member.

10. The light emitting device according to claim 7, wherein a second portion, of the adhesive member contacts the second metal layer and the fourth metal layer, and wherein the second portion of the adhesive member is disposed between the third metal layer and the fourth metal Layer.

11. The light emitting device according to claim 1, further comprising a conductive layer disposed under the first support member, the second support member and the adhesive member.

12. A light emitting device comprising:

a first support member having an opening;

a second support member disposed in the opening of the first support member;

a light emitting chip on the second support member;

an adhesive member disposed between the first and second support members;

a first lead electrode disposed on the first support member;

a second lead electrode disposed on at least one of the first and second support members; and a recess on a top surface of the second lead electrode, wherein the first support member comprises a resin material, wherein the light emitting chip is disposed on the first lead electrode and electrically connected to the first lead electrode and the second lead electrode, wherein the adhesive member is disposed around the second support member and disposed in the opening, and wherein the recess overlaps the adhesive member in a vertical direction.

13. The light emitting device according to claim 12, wherein the first support member is formed of a ceramic material, and wherein a thickness of the first support member is a thicker than a thickness of the second support member.

14. The light emitting device according to claim 12, further comprising a gap between the first lead electrode and the second lead electrode, wherein the second lead electrode extends on the second support member, and wherein the gap overlaps the second support member in the vertical direction.

15. The light emitting device according to claim 14, wherein the first support member comprises:

a resin member;

a first metal layer between a top surface of the resin member and the second lead electrode; and a second metal layer on a bottom surface of the resin member, wherein the light emitting device further comprises:

a third metal layer between the second support member and the first lead electrode; and a fourth metal layer under a bottom surface of the second support, member, and wherein the thickness of the second support member is thicker than a thickness of the first resin layer or a thickness of the second resin layer.

16. The light emitting device according to claim 15, wherein the resin member comprises:

a first resin layer between the first metal layer and the second metal layer;

a second resin layer between the first resin layer and the second metal layer; and an adhesive layer between the first resin layer and the second resin layer, wherein a thickness of the first resin layer is thicker than a thickness of the first metal layer, and wherein a thickness of the second resin layer is thicker than a thickness of the second metal layer.

17. The light emitting, device according to claim 16, wherein the adhesive layer contacts the adhesive member, and wherein the adhesive layer and the adhesive member comprise same material.

18. The light emitting device according to, claim 16, wherein the recess has a concave surface from the top surface of the second lead electrode, and wherein a depth of the recess is formed to be equal to or smaller than ⅓ of the thickness of the second lead electrode.

19. The light emitting device according to claim 15, wherein a first portion of the adhesive, member contacts the first metal layer and the third metal layer, wherein the first portion of the adhesive member is disposed between the first metal layer and the third metal layer, and wherein the recess has a concave curved surface toward the first portion of the adhesive member.

20. The light emitting device according to claim 1, wherein the second support member is formed of AlN material, and wherein the adhesive member contacts the first lead electrode and the second lead electrode.

* * * * *